United States Patent
Xue et al.

(10) Patent No.: US 9,245,861 B2
(45) Date of Patent: *Jan. 26, 2016

(54) WAFER PROCESS FOR MOLDED CHIP SCALE PACKAGE (MCSP) WITH THICK BACKSIDE METALLIZATION

(71) Applicant: Alpha and Omega Semiconductor Incorporated, Sunnyvale, CA (US)

(72) Inventors: Yan Xun Xue, Los Gatos, CA (US); Hamza Yilmaz, Saratoga, CA (US); Yueh-Se Ho, Sunnyvale, CA (US); Jun Lu, San Jose, CA (US); Zhiqiang Niu, Santa Clara, CA (US); Guo Feng Lian, Shanghai (CN); Hong Xia Fu, Shanghai (CN); Yu Ping Gong, Shanghai (CN)

(73) Assignee: ALPHA AND OMEGA SEMICONDUCTOR INCORPORATED, Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/317,152

(22) Filed: Jun. 27, 2014

(65) Prior Publication Data

US 2014/0315350 A1   Oct. 23, 2014

Related U.S. Application Data

(63) Continuation-in-part of application No. 13/602,144, filed on Sep. 1, 2012, now Pat. No. 8,853,003, and a continuation-in-part of application No. 13/931,854, filed on Jun. 29, 2013, now Pat. No. 8,778,735.

(51) Int. Cl.
*H01L 21/461* (2006.01)
*H01L 23/00* (2006.01)
(Continued)

(52) U.S. Cl.
CPC .............. *H01L 24/11* (2013.01); *H01L 21/561* (2013.01); *H01L 21/76898* (2013.01); *H01L 21/78* (2013.01); *H01L 23/492* (2013.01); *H01L 24/94* (2013.01); *H01L 23/3114* (2013.01); *H01L 24/05* (2013.01); *H01L 24/06* (2013.01); *H01L 24/13* (2013.01); *H01L 24/32* (2013.01); *H01L 24/73* (2013.01); *H01L 24/83* (2013.01);
(Continued)

(58) Field of Classification Search
CPC ....... H01L 24/11; H01L 21/561; H01L 24/94; H01L 21/76898; H01L 21/78; H01L 23/492
USPC .......................................................... 438/110
See application file for complete search history.

(56) References Cited

U.S. PATENT DOCUMENTS

| | | | |
|---|---|---|---|
| 7,776,647 B2* | 8/2010 | Farnworth et al. | 438/106 |
| 8,563,361 B2* | 10/2013 | Xue et al. | 438/112 |
| 2011/0018116 A1* | 1/2011 | Feng | 257/690 |

*Primary Examiner* — Walter H Swanson
(74) *Attorney, Agent, or Firm* — Chein-Hwa S. Tsao; Chen-Chi Lin

(57) ABSTRACT

A wafer process for MCSP comprises: depositing a metal bump on bonding pads of chips; forming a first packaging layer at front surface of wafer covering metal bumps while forming an un-covered ring at the edge of wafer to expose the ends of each scribe line located between two adjacent chips; thinning first packaging layer to expose metal bumps; grinding back surface of wafer to form a recessed space and a support ring at the edge of the wafer; depositing a metal seed layer and a thick metal layer at bottom surface of wafer in recessed space in a sequence; cutting off the edge portion of wafer; and separating individual chips from wafer by cutting through first packaging layer, the wafer and the metal seed and metal layers along the scribe line.

13 Claims, 4 Drawing Sheets

(51) Int. Cl.
    *H01L 21/71*     (2006.01)
    *H01L 21/768*     (2006.01)
    *H01L 21/78*     (2006.01)
    *H01L 23/492*     (2006.01)
    *H01L 21/56*     (2006.01)
    H01L 23/31     (2006.01)

(52) U.S. Cl.
CPC ............... *H01L2224/02371* (2013.01); *H01L 2224/0401* (2013.01); *H01L 2224/04026* (2013.01); *H01L 2224/05025* (2013.01); *H01L 2224/0557* (2013.01); *H01L 2224/05571* (2013.01); *H01L 2224/06181* (2013.01); *H01L 2224/11009* (2013.01); *H01L 2224/131* (2013.01); *H01L 2224/13013* (2013.01); *H01L 2224/13014* (2013.01); *H01L 2224/13022* (2013.01); *H01L 2224/32245* (2013.01); *H01L 2224/73104* (2013.01); *H01L 2224/73153* (2013.01); *H01L 2224/83005* (2013.01); *H01L 2224/94* (2013.01); *H01L 2924/00014* (2013.01); *H01L 2924/1306* (2013.01); *H01L 2924/13091* (2013.01); *H01L 2924/181* (2013.01)

US 9,245,861 B2

WAFER PROCESS FOR MOLDED CHIP SCALE PACKAGE (MCSP) WITH THICK BACKSIDE METALLIZATION

CROSS-REFERENCE TO RELATED APPLICATIONS

This Patent Application is a Continuation in Part (CIP) Application of a co-pending application Ser. No. 13/602,144 filed on Sep. 1, 2012 by a common inventor of this Application. The Disclosure made in the patent application Ser. No. 13/602,144 is hereby incorporated by reference.

This Patent Application is a Continuation in Part (CIP) Application of a co-pending application Ser. No. 13/931,854 filed on Jun. 29, 2013 by a common inventor of this Application. The Disclosure made in the patent application Ser. No. 13/931,854 is hereby incorporated by reference.

FIELD OF THE INVENTION

This invention relates to a packaging method of semiconductor devices. Particularly, this invention aims at providing an improved wafer process for MCSP for obtaining thin chip packages with thick backside metal and molding compound on front side and/or backside of the devices.

DESCRIPTION OF THE RELATED ART

In a wafer level chip scale package (WLCSP) technology, the semiconductor chip is packaged directly on the wafer level after the semiconductor chips are finished completely on the wafer following by the separation of individual chip packages from the wafer. As a result, the size of the chip package is same as the size of the original semiconductor chip. Conventionally, the WLCSP technology is widely used for the semiconductor devices. As well known in the art, vertical power device, such as a common drain MOSFETs, has larger Rdson. Therefore, the wafer is thinned to reduce the substrate resistance, thus Rdson is reduced. However, as the wafer is thinner, it is difficult to treat and handle the thin wafer due to lack of the mechanical protection. In addition, to reduce the Rdson in vertical power device, a thick backside metal is required to reduce spreading resistance. Conventional processes usually use a thick lead frame and the semiconductor chips are then attached on the thick lead frame. However, this approach cannot achieve 100% chip scale package.

In addition, in the conventional chip scale packaging technology, the wafer is directly cut along the scribe line at the front surface of the wafer to separate individual chip packages from the wafer. However, the front surface of the wafer is usually packaged with a molding compound before the wafer is thinned to enhance the mechanical support for the wafer to prevent the thinned wafer from cracking. As a result, the scribe line is covered by the molding compound. Therefore, it is difficult to cut the wafer along the scribe line at the front surface of the wafer.

Given the above description of related prior arts, therefore, there is a need to manufacture ultra thin chips with thick backside metal and molding compound on front side and/or backside of the devices by WLCSP.

BRIEF DESCRIPTION OF THE DRAWINGS

As shown in attached drawings, the embodiment of the invention is more sufficiently described. However, the attached drawing is only used for explaining and illustrating rather than limiting the range of the invention.

DETAILED DESCRIPTION OF THE PREFERRED EMBODIMENTS

Figure 1A:
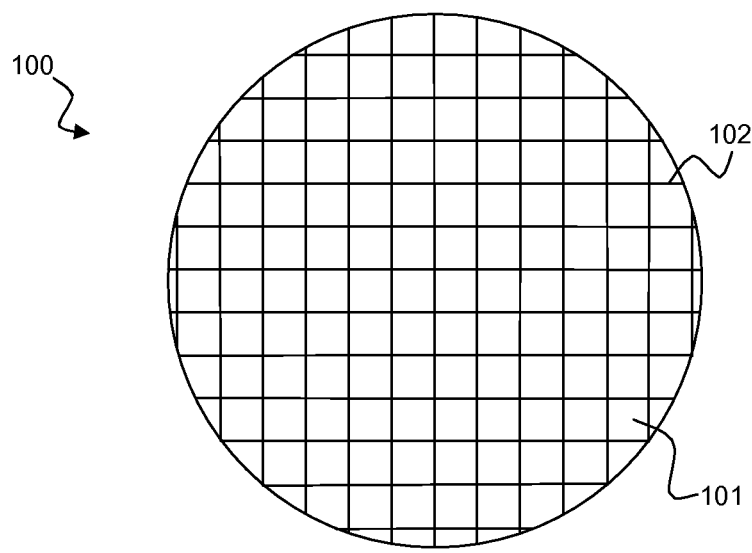
FIG. 1A is a top view of the front surface of a semiconductor wafer having semiconductor chips formed thereon.

FIG. 1A is a top view of a wafer 100 including a plurality of semiconductor chips 101 formed on the front surface of the wafer with each scribe line 102 located between two adjacent chips 101. It is well known in the art that individual chip 101 is separated from the wafer 100 by cutting along the scribe line 102. Generally, a plurality of metal bonding pads (not shown) are formed on the front surface of each chip 101 forming the electrodes of the chip, which connect to the power supply, the ground or a terminal for signal transmission with an external circuit.

Figure 1B:
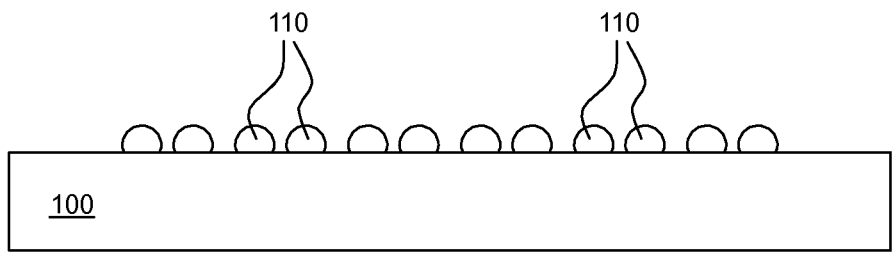
FIG. 1B is a cross-sectional schematic diagram of the semiconductor wafer having metal bump formed on the semiconductor chip's metal bonding pad.

As shown in FIG. 1B, conductive bumps 110, for example metal pumps, are formed on each metal bonding pad at the front surface of each chip 101. The metal bump 110 can be made of a conductive material, such as copper, gold, silver, aluminum and the like or their alloy. The metal bump 110 can have a shape of sphere, ellipse, cube, cylinder, or wedge and the like.

Figure 2A:
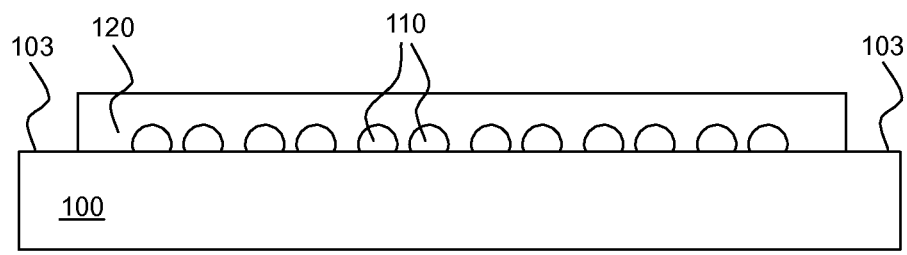
FIGS. 2A-2B are schematic diagrams illustrating the step of depositing a first packaging layer to cover the front surface of the wafer.
Figure 2B:
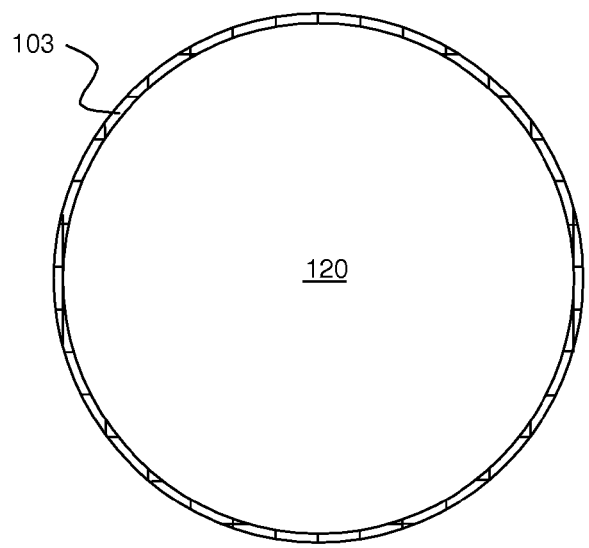

As shown in FIG. 2A, a packaging material, such as epoxy resin and the like, is deposited to form a first packaging layer 120 with a certain thickness covering the front surface of the wafer 100 and all metal bumps 110. As shown in FIGS. 2A and 2B, the radius of the first packaging layer 120 is slightly smaller than the radius of the wafer 100, as such the first packaging layer 120 does not cover the whole front surface of the wafer 100, for example, an un-covered ring 103 close to the edge of the wafer is not covered by the first packaging layer 120.

Figure 3A:
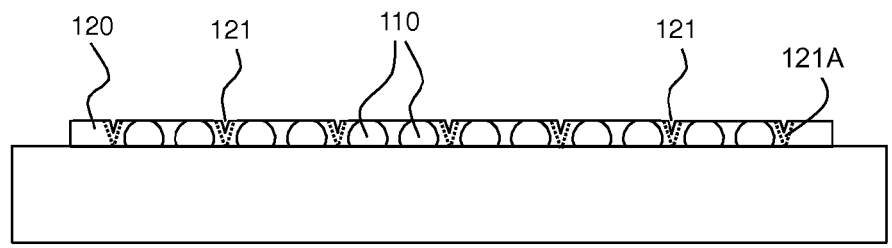
FIGS. 3A-3B are schematic diagrams illustrating steps of grinding to thin the first packaging layer and forming cutting grooves on the first packaging layer.
Figure 3B:
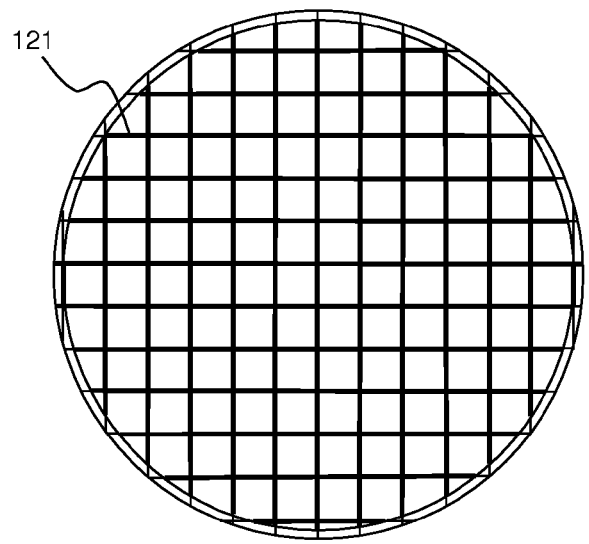

As shown in FIG. 3A, the first packaging layer 120 is ground to expose the metal bumps 110. In one embodiment, the thickness of the first packaging layer 120 after grinding is about 50 microns to 100 microns. The metal bump 110 is preferably made of a harder metal, for example copper, to eliminate the unexpected contamination at the grinding surface of the first packaging layer 120 when the dust from the metal bump is adhered on the grinding wheel while grinding the first packaging layer. In FIG. 3A, a plurality of cutting grooves 121 are then formed on the front surface of the thinned first packaging layer 120. As shown in FIG. 2B, the radius of the first plastic packaging layer 120 is smaller than the radius of the wafer 100 to ensure that the two ends of each scribe line 102 in the un-covered ring 103 is not covered by the first plastic packaging layer 120. The cutting groove 121 can be formed by cutting a shallow line on the front surface of the first packaging layer 120, which is aligned with a scribe line 102 extending from its two ends exposed in the un-covered ring 103. Particularly, each shallow line or cutting groove 121 is overlapped with the corresponding scribe line 102 as shown in FIG. 3B. The depth of the cutting groove 121 can be adjusted. In one embodiment, the cutting groove 121A (as shown in dashed lines in FIG. 3A) can penetrate through the first packaging layer 120 to the front surface of the wafer.

Figure 4:
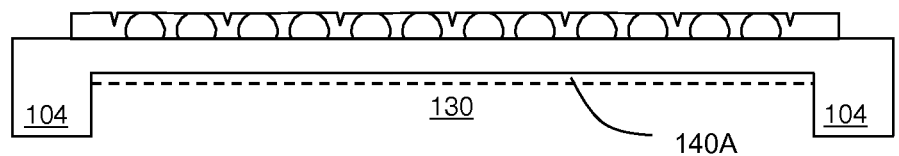
FIG. 4 is a cross-sectional schematic diagram illustrating the step of grinding to thin the wafer from its back surface.

As shown in FIG. 4, the wafer 100, with an original thickness of 760 microns, is ground at its back surface to a predetermined thickness, which is about 50 microns to 100 microns. In a preferred embodiment, the ground first plastic package layer is thicker than the ground wafer for a mechanical support. In addition, to provide a mechanical support for the thinned wafer, a support ring at the edge of the wafer is not ground. As shown in FIG. 4, a recessed space 130 is formed by grinding the back surface of the wafer 100 with a grinding wheel having a radius smaller than the radius of the wafer 100. The radius of the recessed space 130 is as large as possible to maximize the yield of chips formed close to the edge of the wafer. In this step, a support ring 104 at the edge of the wafer 100 is formed and the width of the support ring 104 is the difference between the radius of the wafer 100 and the radius of the recessed space 130. In this step, the designed thickness of the thin wafer 100 can be adjusted by the depth of the recessed space 130. The support ring 104 and the thinned packaging layer 120 provide a mechanical support for the thinned wafer 100, thus the thinned wafer is not easy to crack. In one embodiment, the radius of the recessed space 130 is smaller than the radius of the first packaging layer 120 in order to further maintain the mechanical strength of the thinned wafer 100, so that a portion of the first packaging layer 120 can be partially overlapped with a portion of the support ring 104. In examples of the present disclosure, an optional metal layer 140A is deposited at the bottom surface of the wafer 100 in the recessed space 130 for an Ohmic contact and used as a barrier for the metal seed layer 140 (FIG. 5) to diffuse into the semiconductor wafer 100.

Figure 5:
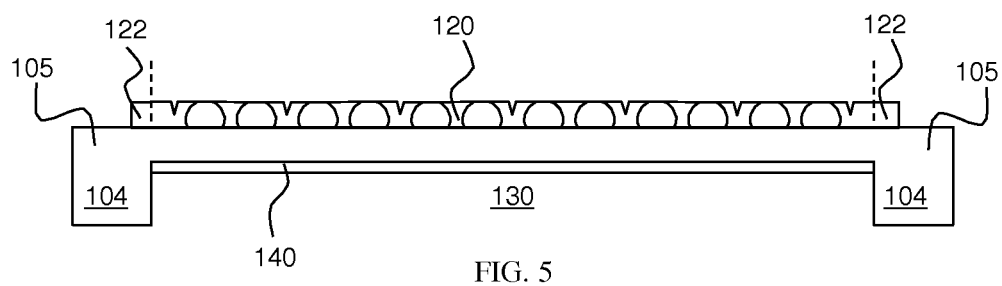
FIG. 5 is a cross-sectional schematic diagram illustrating the step of depositing a thin metal layer at the bottom surface of the thinned wafer.

As shown in FIG. 5, optionally, dopants are heavily doped at the bottom surface of the wafer 100 exposed inside the recessed space 130 followed by the annealing for dopants to diffuse. Then, a thin metal layer 140, such as TiNiAg, TiNi, TiNiAL and the likes, is deposited at the bottom surface of the wafer 100, for example by evaporation or sputtering. The thin metal layer 140 may be used as a seed layer 140 for the deposition of a thick metal layer in a next step.

Figure 6:
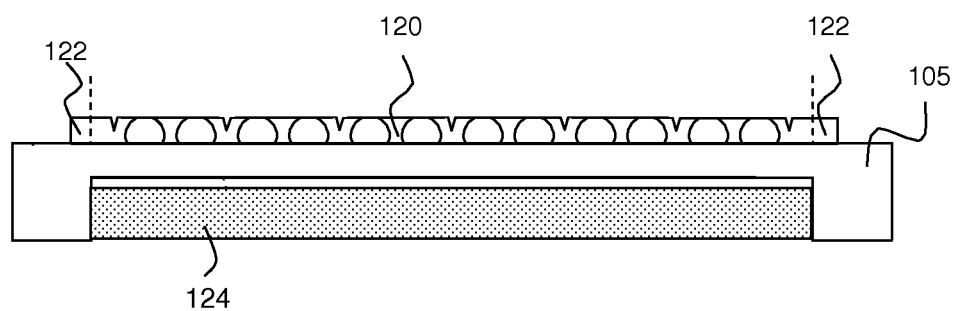
FIG. 6 is a cross-sectional schematic diagram illustrating the step of depositing a thick metal layer on the thin metal layer at the bottom of the thinned wafer.

As shown in FIG. 6, a thick bottom metal layer 124 is deposited atop the thin metal layer 140 by electroplating and/or electroless plating. The metal layer 124 can be Ag, Cu, Ni and the likes. The thickness of the bottom metal layer 124 is about 10 microns to 100 microns depending on the size of the semiconductor chips formed on the wafer. In general bottom metal layer 124 should be at least ⅒ of the wafer thickness for wafer grounded to 100 microns or less. For wafer grounded to 50 microns, the bottom metal layer should be at least ⅕ of the wafer thickness, preferably more than ½ of the wafer thickness. In one embodiment, with a thickness of the ground wafer (in FIG. 4) of about 50 microns, a bottom metal layer with a thickness larger than 50 microns is deposited. For wafer grounded less than 50 micron, bottom metal layer 124 should be more than ½ of the wafer thickness. As the metal layer 124 is formed by deposition, no adhesive material such as solder or epoxy between the wafer bottom surface and the surfaces of the bottom metal layer. Thick meal layer not only provides the benefit of resistance reduction and better heat dissipation, but also provides the mechanical support for the integrity of the wafer and semiconductor chip during the fabrication process especially after the thickness of the wafer is reduced less than 100 micron.

Figure 7:
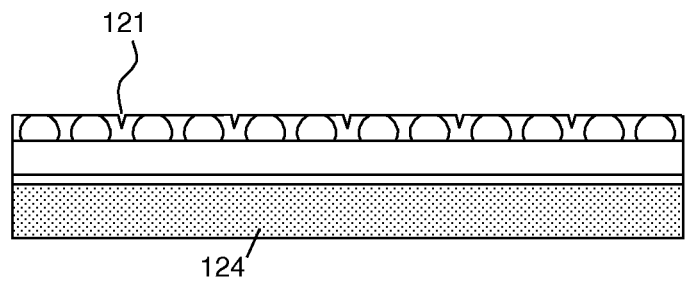
FIG. 7 is a cross-sectional schematic diagram illustrating the step of cutting the edge portion of the wafer.

As shown in FIG. 7, the edge portion 105 of the thinned wafer 100 and the support ring 104 are cut off, as such the overlapped part 122 of the first packaging layer 120 is also cut off with the width of the cut portion 105 of the wafer being equal to or slightly greater than the width of the support ring 104.

Figure 8:
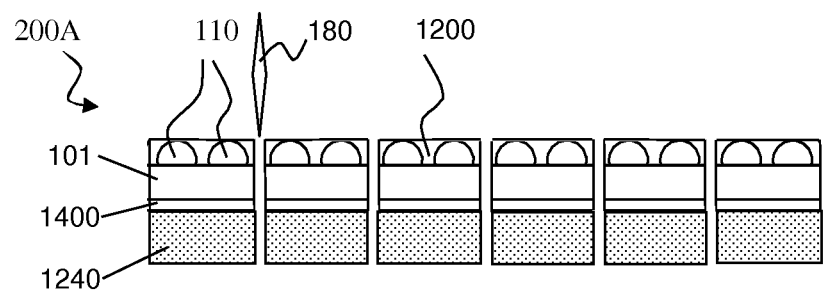
FIG. 8 is a cross-sectional schematic diagram illustrating the step of separating individual packaging structures with backside metal exposed by cutting through the first packaging layer, the wafer and the metal layer.

As shown in FIG. 8, the first packaging layer 120, the wafer 100, the seed layer 140 and the thick bottom metal layer 124 can be cut through by a cutter 180 along the cutting groove 121 to separate individual chips 101 from the wafer 100. As a result, the first packaging layer 120 can be cut into a plurality of top packaging layers 1200, the seed layer 140 can be cut into a plurality of seed layers 1400, and the thick bottom metal layer 124 can be cut into a plurality of thick bottom metal layer 1240, thus a plurality of wafer-level packaging structures 200A are obtained. Each packaging structure 200A includes a top packaging layer 1200 covering the front surface of each chip 101, a seed layer 1400 covering the back surface of the chip 101 and a thick bottom metal layer covering the seed layer 1400 with the metal bump 110 exposed out from the top packaging layer 1200 functioning as contact terminals of the packaging structure 200A to electrically connect the external circuit and the thick bottom metal layer 1240 exposed at the bottom of the packaging structures 200A functioning as a contact terminal of the packaging structure 200A and also for heat dissipation.

In one embodiment, the chip 101 is a vertical MOSFET Metal-Oxide-Semiconductor Field Effect Transistor), in which the current flows from the front surface to the back surface of the chip or vice versa. As such, the plurality of metal bonding pads formed at the front surface of the chip includes a bonding pad forming a source electrode and a bonding pad forming a gate electrode, and the bottom metal layer 1240 forms the drain electrode of the chip. With the thick bottom metal layer 1240, the resistance of the packaging structures 200A can be greatly reduced.

Figure 9:
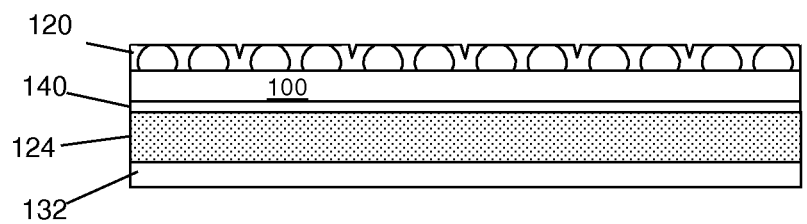
FIG. 9 is cross-sectional schematic diagrams illustrating a step of forming a second packaging layer on the thick metal layer before separating the individual packaging structures of the device structure in FIG. 7.
Figure 10:
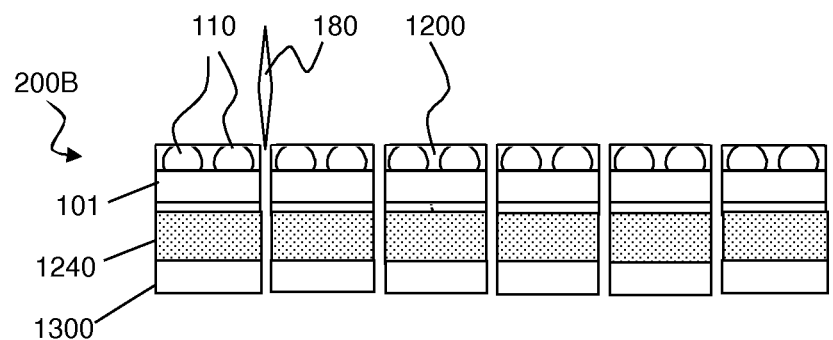
FIG. 10 is cross-sectional schematic diagram illustrating a step of separating individual packaging structures of the device structure in FIG. 9 with molding compound on top and bottom sides of the packaging structure by cutting through the first packaging layer, the wafer, the metal layer and the second packaging layer.

In another embodiment, a packaging structure 200B with a bottom packaging layer 1300 can be formed as shown in FIGS. 9-10. After the edge portion 105 of the thinned wafer, the overlapped part 122 and the support ring 104 are cut of, as shown in FIG. 7, a second packaging layer 132 is formed to cover the thick bottom metal layer 124 as shown in FIG. 9. Then the first packaging layer 120, the wafer 100, the seed layer 140, the thick bottom metal layer 124 and the second packaging layer 132 are cut to separate individual chips 101 from the wafer 100. As a result, the first packaging layer 120 is cut into a plurality of top packaging layers 1200, the seed layer 140 is cut into a plurality of seed layers 1400, the thick bottom metal layer 124 is cut into a plurality of thick bottom metal layers 1240 and the second packaging layer 132 is cut into a plurality of bottom packaging layer 1300, thus a plurality of packaging structures 200B are obtained. Each packaging structure 200B includes a top packaging layer 1200 covering the front surface of the chip 101, a seed layer 1400 covering the back surface of the chip 101, a thick bottom metal layer 1240 covering the seed layer 1400, and a bottom packaging layer 1300 covering the thick bottom metal layer 1240 with the metal bump 110 exposed out of the top packaging layer 1200 functioning as a contact terminal of the packaging structure 200B for electrically connecting with the external circuit. In this embodiment, since the thick bottom metal layer 1240 is covered by the bottom packaging layer 1300, the bottom metal layer 1240 cannot be used as the contact terminal for connecting with the external circuit. As such, when the chip 101 is a vertical MOSFET, the plurality of metal bonding pads formed at the front surface of the chip include a bonding pad forming a source electrode, a bonding pad forming a gate electrode, and bonding pads electrically connecting to the bottom metal layer 1240 forming the drain electrode through a metal interconnecting structure (not shown) formed in the chip.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A wafer process for molded chip scale package (MCSP) for packaging semiconductor chips formed at a front surface of a semiconductor wafer, each semiconductor chip comprising a plurality of metal bonding pads formed on a front surface of each semiconductor chip, comprising the steps of:
   forming a metal bump on each of the metal bonding pads;
   forming a first packaging layer at the front surface of the wafer to cover the metal bump, wherein a radius of the first packaging layer is smaller than a radius of the wafer forming an un-covered ring at an edge of the wafer, wherein two ends of each scribe line are located between two adjacent semiconductor chips and extend on a front surface of the un-covered ring;
   thinning the first packaging layer to expose the metal bump from the first packaging layer;
   forming a cutting groove on a front surface of the thinned first packaging layer along each scribe line by cutting on the first packaging layer along a straight line extended by the two ends of each scribe line exposed on the front surface of the un-covered ring;
   grinding at a back surface of the wafer to form a recessed space at the back surface of the wafer and a support ring at the edge of the wafer;
   depositing a metal seed layer at a bottom surface of the wafer in the recessed space;
   depositing a metal layer covering the metal seed layer;
   cutting off an edge portion of the wafer; and
   separating the individual semiconductor chips from the wafer by cutting through the first packaging layer, the wafer, the metal seed layer and the metal layer along the cutting groove, wherein the first packaging layer is cut into a plurality of top packaging layers each of which covers the front surface of each semiconductor chip with the metal bump exposed from the first packaging layer, and wherein the metal layer is cut into a plurality of bottom metal layers each of which covers a back surface of each semiconductor chip.

2. The wafer process of claim 1, wherein the cutting groove extends to the front surface of the wafer.

3. The wafer process of claim 1, wherein cutting off the edge portion of the wafer comprises cutting off the support ring.

4. The wafer process of claim 3, wherein a radius of the recessed space is smaller than the radius of the first packaging layer so that a portion of the first packaging layer is overlapped with a portion of the support ring, and wherein cutting off the edge portion of the wafer comprises cutting off the support ring and the overlapped portion of the first packaging layer.

5. The wafer process of claim 1, before depositing the metal seed layer, further comprising depositing another metal layer at the bottom surface of the wafer in the recessed space for an Ohmic contact and used as a barrier for the metal seed layer not to diffuse into the semiconductor wafer.

6. The wafer process of claim 1, wherein the recessed space is formed by a grinding wheel with a radius smaller than the radius of the wafer.

7. The wafer process of claim 1, after cutting off the edge portion of the wafer, further comprising forming a second packaging layer on the metal layer, wherein separating individual semiconductor chips from the wafer comprises cutting through the first packaging layer, the wafer, the seed layer, the metal layer and the second packaging layer along the cutting groove, wherein the second packaging layer is cut into a plurality of bottom packaging layers each of which covers on the bottom metal layer of each semiconductor chip.

8. The wafer process of claim 1, wherein the seed layer is deposited by evaporation or sputtering.

9. The wafer process of claim 8, wherein the seed layer comprises TiNiAg, TiNi, TiNiAl.

10. The wafer process of claim 8, wherein the metal layer is deposited by electroplating and/or electroless plating.

11. The wafer process of claim 10, wherein the metal layer comprises Ag, Cu, Ni.

12. The wafer process of claim 1, wherein the thinned first packaging layer is thicker than the wafer after the grinding.

13. The wafer process of claim 1, wherein the metal layer is more than $1/10$ of a wafer thickness after the grinding.

* * * * *